(12) United States Patent
Miyamoto et al.

(10) Patent No.: US 10,499,514 B2
(45) Date of Patent: Dec. 3, 2019

(54) VEHICULAR CONTROL DEVICE

(71) Applicant: MITSUBISHI ELECTRIC CORPORATION, Chiyoda-ku, Tokyo (JP)

(72) Inventors: Naoya Miyamoto, Tokyo (JP); Yasuaki Mamoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/565,698

(22) PCT Filed: May 12, 2015

(86) PCT No.: PCT/JP2015/063620
§ 371 (c)(1),
(2) Date: Oct. 11, 2017

(87) PCT Pub. No.: WO2016/181494
PCT Pub. Date: Nov. 17, 2016

(65) Prior Publication Data
US 2018/0084656 A1 Mar. 22, 2018

(51) Int. Cl.
*H05K 7/20* (2006.01)
*H05K 5/00* (2006.01)
(Continued)

(52) U.S. Cl.
CPC ........... *H05K 5/0017* (2013.01); *B61C 17/00* (2013.01); *B61C 17/12* (2013.01); *H05K 5/0021* (2013.01);
(Continued)

(58) Field of Classification Search
None
See application file for complete search history.

(56) References Cited

U.S. PATENT DOCUMENTS 6,259,616 B1 * 7/2001 Ekwall ................. H02M 7/003
363/132
9,648,769 B2 * 5/2017 Tramet ................. H05K 7/1432
(Continued)

FOREIGN PATENT DOCUMENTS

JP 2011-138960 A 7/2011
JP 2015-077865 A 4/2015
(Continued)

OTHER PUBLICATIONS

International Search Report (PCT/ISA/210) dated Aug. 4, 2015, by the Japanese Patent Office as the International Searching Authority for International Application No. PCT/JP2015/063620.
(Continued)

*Primary Examiner* — Courtney L Smith
(74) *Attorney, Agent, or Firm* — Buchanan Ingersoll & Rooney PC (57) ABSTRACT

A vehicular control device includes: one housing to contain modules having electronic components; a main circuit wiring connecting a first pair of modules; a main circuit wiring connecting a second pair of modules; and a main circuit wiring connecting a third pair of modules. The main circuit wiring, in which a maximum value of current flowing therein is greater than or equal to a first threshold, extends to an exterior of the housing.

12 Claims, 6 Drawing Sheets

(51) Int. Cl.
  *B61C 17/00*  (2006.01)
  *B61C 17/12*  (2006.01)
  *H05K 5/02*   (2006.01)
  *H05K 5/03*   (2006.01)
  *H05K 5/06*   (2006.01)
  *B60R 16/023* (2006.01)
  *B61C 3/00*   (2006.01)

(52) U.S. Cl.
  CPC ............ *H05K 5/0247* (2013.01); *H05K 5/03* (2013.01); *H05K 5/069* (2013.01); *H05K 7/2089* (2013.01); *H05K 7/20409* (2013.01); *H05K 7/20918* (2013.01); *B60R 16/0231* (2013.01); *B61C 3/00* (2013.01)

(56) References Cited

U.S. PATENT DOCUMENTS

| | | | | |
|---|---|---|---|---|
| 2008/0130223 A1* | 6/2008 | Nakamura | ............ | H02M 7/003 361/689 |
| 2009/0231811 A1* | 9/2009 | Tokuyama | ............. | H01L 23/36 361/699 |
| 2011/0176281 A1 | 7/2011 | Ikemoto et al. | | |
| 2013/0322141 A1* | 12/2013 | Kobayashi | ............ | H02M 7/003 363/123 |
| 2014/0045353 A1* | 2/2014 | Balcerak | .............. | H01R 13/514 439/136 |
| 2014/0313806 A1* | 10/2014 | Shinohara | .......... | H05K 7/20927 363/141 |
| 2014/0345492 A1 | 11/2014 | Fujito et al. | | |
| 2015/0349656 A1* | 12/2015 | Tokuyama | .............. | H01L 23/36 363/132 |
| 2017/0141379 A1* | 5/2017 | Biskup | ................... | H01H 85/06 |
| 2018/0109016 A1* | 4/2018 | Fees | ....................... | H01R 9/226 |

FOREIGN PATENT DOCUMENTS

| | | |
|---|---|---|
| WO | WO 2010/041339 A1 | 4/2010 |
| WO | WO 2013/121719 A1 | 8/2013 |

OTHER PUBLICATIONS

Written Opinion (PCT/ISA/237) dated Aug. 4, 2015, by the Japanese Patent Office as the International Searching Authority for International Application No. PCT/JP2015/063620.

\* cited by examiner

VEHICULAR CONTROL DEVICE

TECHNICAL FIELD

The present disclosure relates to a vehicular control device.

BACKGROUND ART

With respect to vehicular control devices mounted on electric railway vehicles, vehicular control devices are being developed that decrease maintenance work, that enable size and weight reduction with the practical use of fully silicon carbide (SiC) based components, and the like.

In a vehicular control device disclosed in Patent Literature 1, each of multiple functional modules forming the vehicular control device has an interface surface on which both the signal lines and power lines are connected together at one side surface, and each of the interface surfaces is arranged facing in the same direction, thus enabling mounting and detaching of the power lines and signal lines from the one side surface.

In a vehicular control device having an housing using, in order to reduce maintenance work, stainless steel, which has a lower thermal conductivity than iron, aluminum, or the like, or in a reduced-size or reduced-weight vehicular control device, a problem occurs in that housing internal temperature rises due to generation of heat by electronic components within the housing.

A vehicular power conversion device disclosed in Patent Literature 2 is provided with an air channel and fan, and thus heat generated by a power unit arranged in a control box is efficiently released to the exterior.

CITATION LIST

Patent Literature

Patent Literature 1: International Publication No. WO2010/041339

Patent Literature 2: Unexamined Japanese Patent Application Kokai Publication No. 2011-138960

SUMMARY OF INVENTION

Technical Problem

In the vehicular power conversion device disclosed in Patent Literature 2, temperature in the hermetically sealed housing interior rises due to heat generated by heat-generating bodies other than the power unit, and raised temperature may adversely affect components within the housing that have low heat resistance.

The present disclosure is developed in consideration of the aforementioned circumstances, and an objective of the present disclosure is to, by a more simplified structure, suppress the rise of temperature within the housing of the vehicular control device.

Solution to Problem

In order to attain the aforementioned objective, the vehicular control device of the present disclosure includes: a housing to contain a plurality of modules having electronic components; a main circuit wiring to interconnect the modules contained in the housing; and a covering member. The main circuit wiring, for which a maximum value of current flowing therein is greater than or equal to a first threshold, extends to the exterior of the housing. The covering member covers a portion of the main circuit wiring extending to the exterior of the housing. The covering member is waterproof, has an electrical conductivity less than or equal to a second threshold, and has a thermal conductivity greater than or equal to a third threshold.

Advantageous Effects of Invention

According to the present disclosure, the main circuit wiring is extended to the exterior of the housing of the vehicular control device, thereby enabling, by a more simple configuration, suppression of the rise of temperature within the housing of the vehicular control device.

DESCRIPTION OF EMBODIMENTS

Embodiments of the present disclosure are described below in detail in reference to figures. In the figures, components that are the same or equivalent are assigned the same reference signs.

Embodiment 1

Figure 1:
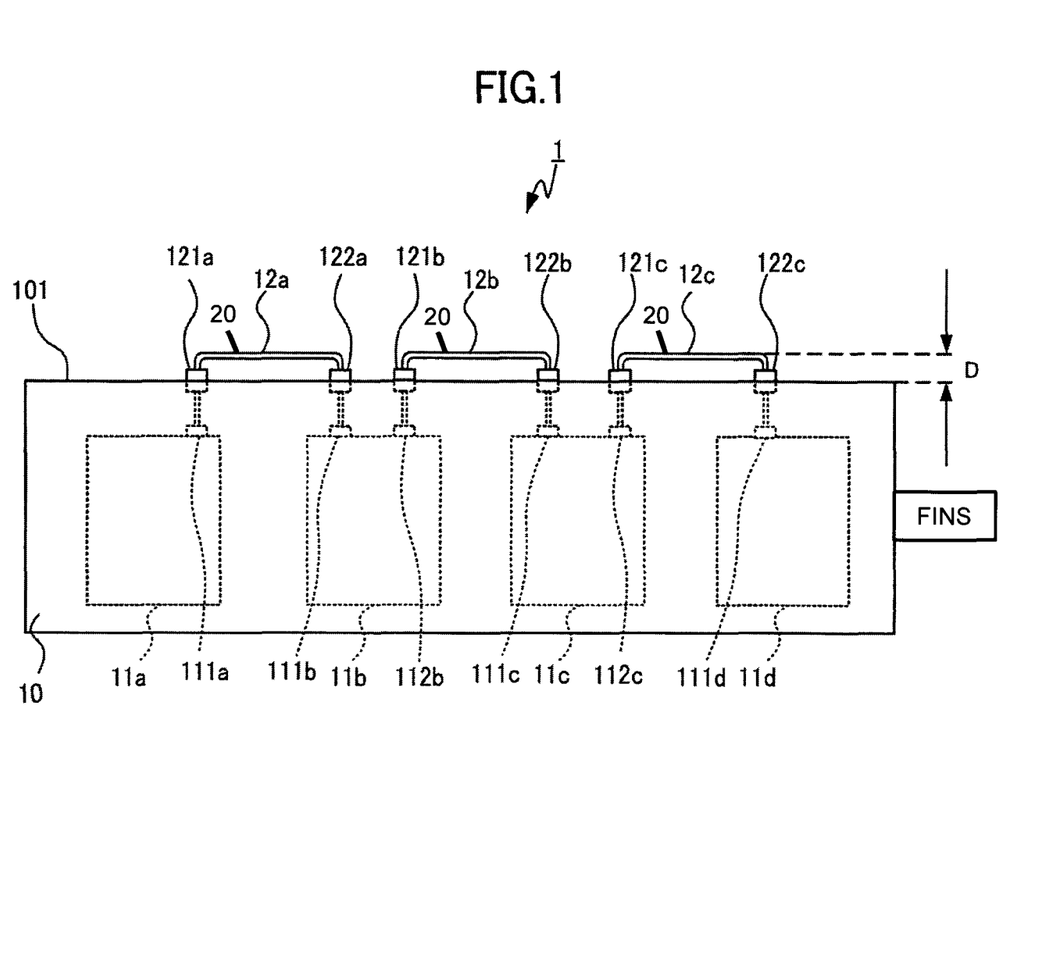
FIG. 1 is a front view of a vehicular control device according to Embodiment 1 of the present disclosure.
Figure 2:
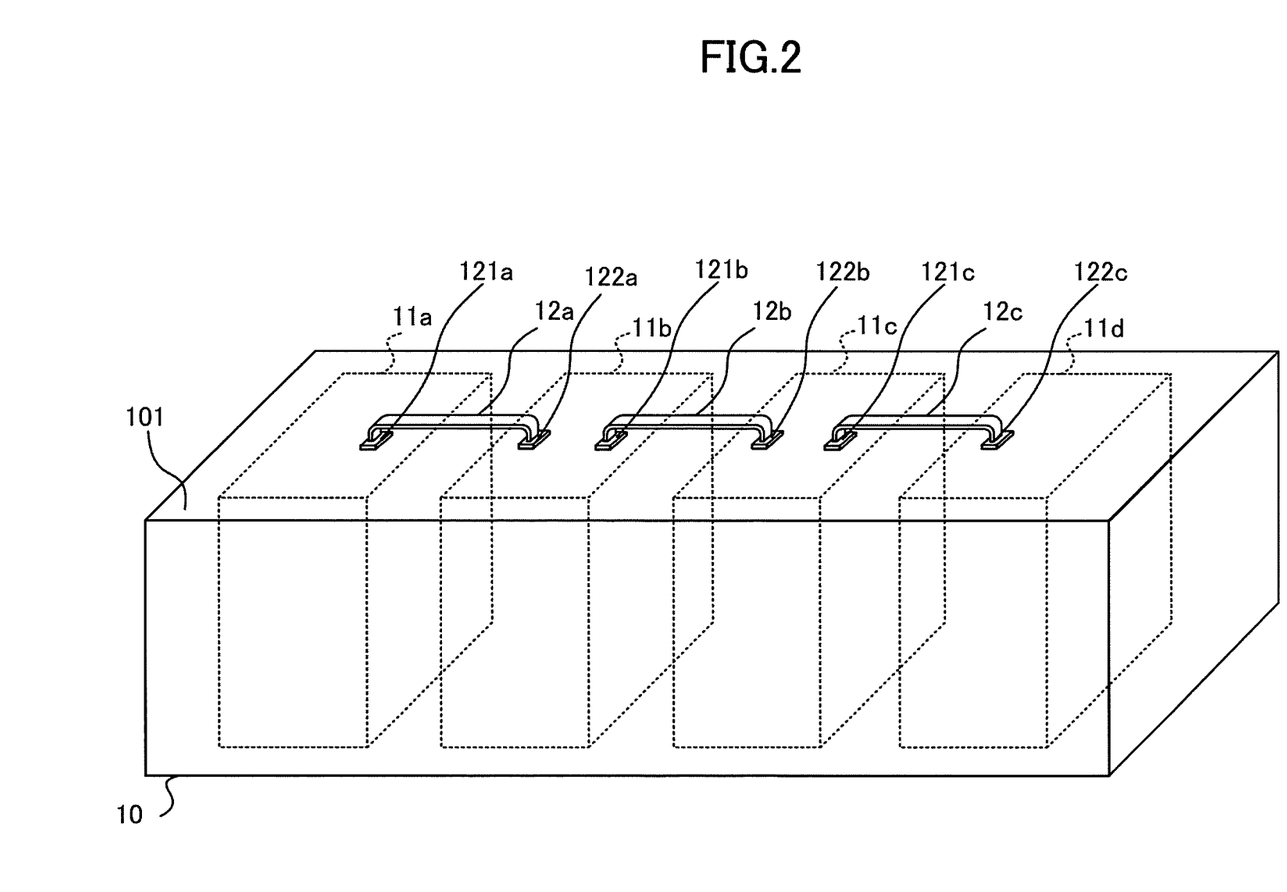
FIG. 2 is a perspective view of the vehicular control device according to Embodiment 1.

FIG. 1 is a front view of a vehicular control device according to Embodiment 1 of the present disclosure. FIG. 2 is a perspective view of the vehicular control device according to Embodiment 1. The vehicular control device 1 includes: a housing 10 containing modules 11a, 11b, 11c, and 11d having electronic components such as a capacitor, a resistor, a switch, and the like; a main circuit wiring 12a connecting the modules 11a and 11b; a main circuit wiring 12b connecting the modules 11b and 11c; and a main circuit wiring 12c connecting the modules 11c and 11d. Further, main circuit wirings that connect each of the modules 11a, 11b, 11c, and 11d and do not extend to the exterior of the housing 10 are not illustrated. The main circuit wirings 12a, 12b, and 12c, for which a maximum value of current flowing therein is greater than or equal to a first threshold, extend to the exterior of the housing 10.

The first threshold can be determined as required in response to the heat dissipation performance desired for the vehicular control device 1. For example, the first threshold may be set to a value that is approximately a value of current supplied by the vehicular control device 1 to a main drive driven by the vehicular control device 1. Alternatively, for example, the first threshold may be determined in order to extend to the exterior of the housing 10, among the main circuit wirings connecting the modules 11a, 11b, 11c, and 11d, the main circuit wiring through which a main current flows and which mainly contributes to the rise in temperature of the interior of the housing 10. By extending to the exterior of the housing 10 the main circuit wiring 12a, 12b, or 12c through which large current flows, and by dissipating the generated heat of the main circuit wiring 12a, 12b, or 12c into the air, the rise of temperature in the interior of the housing 10 of the vehicular control device 1 can be prevented.

Each part of the vehicular control device 1 is described below in detail. The modules 11a, 11b, 11c, and 11d are contained in the interior of one housing 10 of the vehicular control device 1. Each of the modules 11a, 11b, 11c, and 11d is a circuit forming the vehicular control device 1, such as a switch circuit, a transformer circuit, a discharge circuit, or the like, and each of the modules 11a, 11b, 11c, and 11d includes any number of electronic components. The module 11a, for example, has a discharge switch and a discharge resistance. The number of modules contained in the interior of the housing 10 of the vehicular control device 1 is not limited to 4 modules, and the number of modules is freely selected as at least 2 modules.

The main circuit wiring 12a connects a connecting part 111a of the module 11a and a connecting part 111b of the module 11b, and electrically connects the modules 11a and 11b. The main circuit wiring 12b connects a connecting part 112b of the module 11b and a connecting part 111c of the module 11c, and electrically connects the modules 11b and 11c. The main circuit wiring 12c connects a connecting part 112c of the module 11c and a connecting part 111d of the module 11d, and electrically connects the modules 11c and 11d.

The main circuit wiring 12a passes through wiring outlet ports 121a and 122a and extends to the exterior of the housing 10. The main circuit wiring 12b passes through wiring outlet ports 121b and 122b and extends to the exterior of the housing 10. The main circuit wiring 12c passes through wiring outlet ports 121c and 122c and extends to the exterior of the housing 10. The wiring outlet ports 121a, 122a, 121b, 122b, 121c, and 122c have a waterproof structure such as a cable gland, for example.

The portions of the main circuit wirings 12a, 12b, and 12c extending to the exterior of the housing 10 are coated by a covering member 20. The covering member 20 is a member that is waterproof, has an electrical conductivity less than or equal to a second threshold, and has a thermal conductivity greater than or equal to a third threshold. The second threshold is a value sufficiently small that the covering member 20 may be regarded as electrically insulating. Further, the third threshold can be determined as required in response to the heat dissipation performance desired for the vehicular control device 1 and the amount of heat generation of the main circuit wirings 12a, 12b, and 12c. For example, a silicone rubber tape is wound around the circumferences of the main circuit wirings 12a, 12b, and 12c by overlapping successive convolutions of the silicone rubber tape by about one half tape width, and by winding on top of the silicone rubber tape a waterproofing tape by overlapping successive convolutions of the waterproofing tape by about one half tape width.

Extending the main circuit wirings 12a, 12b, and 12c having a large amount of heat generation to the exterior of the housing 10 lowers the amount of heat generation in the interior of the housing 10 and enables suppression of the rise of temperature of the interior of the housing 10.

In the example of FIG. 1, portions of the main circuit wirings 12a, 12b, and 12c extending to the exterior of the housing 10 are arranged at positions displaced from the housing 10. By providing of the main circuit wirings 12a, 12b, and 12c at positions displaced from the housing 10, the heat generated by the main circuit wirings 12a, 12b, and 12c can be dissipated into the air while preventing transfer of the heat to the housing 10, thereby enabling improvement of heat dissipation performance of the vehicular control device 1.

Further, as illustrated in FIG. 1, a distance from a housing upper surface 101 to upper surfaces of the main circuit wirings 12a, 12b, and 12c is taken to be D. By making the distance D less than a length in a direction of attachment of a component, such as a raised framework, for attaching the vehicular control device 1 to the vehicle main body, in a state in which the vehicular control device 1 is attached to the vehicle main body, the main circuit wirings 12a, 12b, and 12c can be provided on a surface facing the vehicle main body, and dead space can be put to practical use.

As described above, according to the vehicular control device 1 according to Embodiment 1, electrical insulation and waterproofing of the main circuit wirings 12a, 12b, and 12c are secured, the main circuit wirings 12a, 12b, and 12c are extended to the exterior of the housing 10, and the heat generated by the main circuit wirings 12a, 12b, and 12c is released into the air, thereby making possible the suppression of rise in temperature of the interior of the housing 10 of the vehicular control device 1 by a further simplified configuration. Further, the extending of the main circuit wirings 12a, 12b, and 12c to the exterior of the housing 10 enables size reduction of the vehicular control device 1.

Embodiment 2

Figure 3:
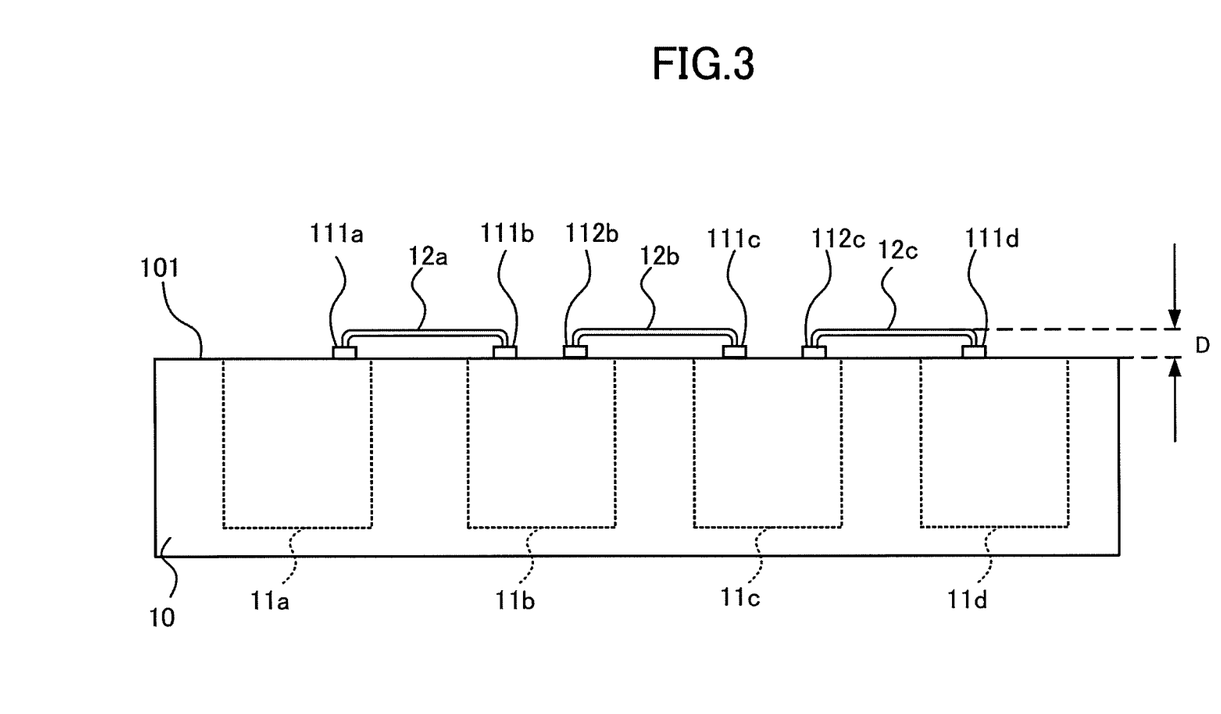
FIG. 3 is a front view of a vehicular control device according to Embodiment 2 of the present disclosure.
Figure 4:
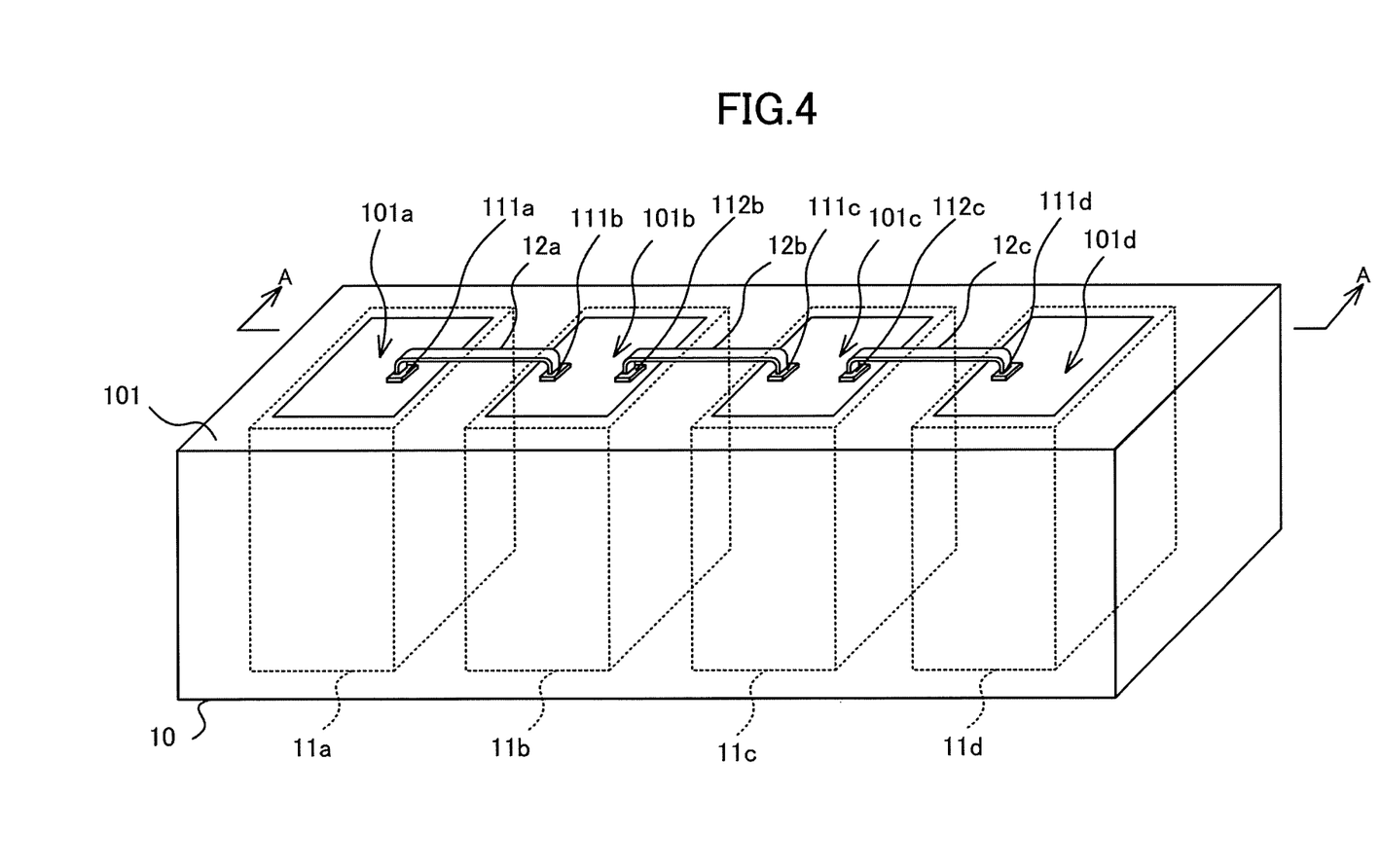
FIG. 4 is a perspective view of the vehicular control device according to Embodiment 2.

FIG. 3 is a front view of a vehicular control device according to Embodiment 2 of the present disclosure. FIG. 4 is a perspective view of the vehicular control device according to Embodiment 2. In Embodiment 2, electronic components are contained in the interior of each housing of modules 11a, 11b, 11c, and 11d, and one surface of the housing of the modules 11a, 11b, 11c, and 11d forms part of the exterior surface of the housing 10.

Openings 101a, 101b, 101c, and 101d are provided in the housing upper surface 101. The opening 101a faces one surface of the module 11a having the connecting part 111a, and has an external shape smaller than the external shape of the one surface of the module 11a. The opening 101b faces one surface of the module 11b having the connecting parts 111b and 112b, and has an external shape smaller than the external shape of the one surface of the module 11b. The opening 101c faces one surface of the module 11c having the connecting parts 111c and 112c, and has an external shape smaller than the external shape of the one surface of the module 11c. The opening 101d faces one surface of the module 11d having the connecting part 111d, and has an external shape smaller than the external shape of the one surface of the module 11d. The one surface of the modules 11a, 11b, 11c, and 11d facing the openings 101a, 101b, 101c, and 101d, respectively, is formed from a component that is waterproof.

Figure 5:
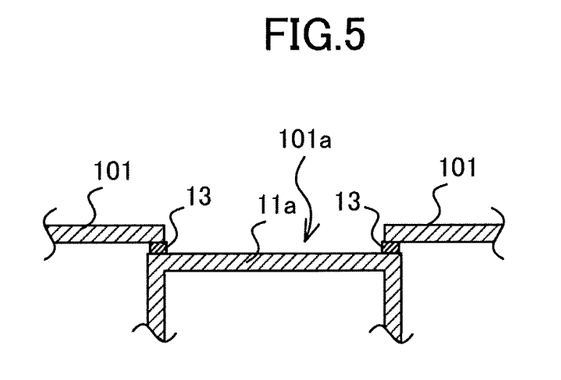
FIG. 5 is a cross-sectional drawing of the vehicular control device according to Embodiment 2.

A waterproofing member is provided between the housing upper surface 101 and each of the modules 11a, 11b, 11c, and 11d. FIG. 5 is a cross-sectional drawing of the vehicular control device according to Embodiment 2. FIG. 5 is an magnified cross-sectional thawing taken along the A-A line in FIG. 4. A waterproofing member 13 is provided along the opening 101a and contacts the housing upper surface 101 and one surface of the module 11a having the connecting part 111a. In a similar manner, the waterproofing member 13 is provided along the opening 101b and contacts the housing upper surface 101 and one surface of the module 11b having the connecting parts 111b and 112b. The waterproofing member 13 is provided along the opening 101c and contacts the housing upper surface 101 and one surface of the module 11c having the connecting parts 111c and 112c. The waterproofing member 13 is provided along the opening 101d and contacts the housing upper surface 101 and one surface of the module 11d having the connecting part 111d. The connecting parts 111a, 111b, 112b, 111c, 112c, and 111d, for example, have waterproof structures such as cable glands or the like.

The main circuit wiring 12a passes through the opening 101a, connects to the connecting part 111a, and passes through the opening 101b and connects to the connecting part 111b. In a similar manner, the main circuit wiring 12b passes through the opening 101b, connects to the connecting part 112b, passes through the opening 101c, and connects to the connecting part 111c. The main circuit wiring 12c passes through the opening 101c, connects to the connecting part 112c, passes through the opening 101d, and connects to the connecting part 111d.

By one surface of each of the modules 11a, 11b, 11c, and 11d forming the exterior surface of the housing 10, the heat generated by the electronic components included in the modules 11a, 11b, 11c, and 11d can be more efficiently dissipated to the air. Further, forming the exterior surface of the housing 10 by the one surface of the modules 11a, 11b, 11c, and 11d enables further reduction in size of the vehicular control device 1.

As described above, according to the vehicular control device 1 according to Embodiment 2 of the present disclosure, forming the exterior surface of the housing 10 from the one surface of the modules 11a, 11b, 11c, and 11d enables suppression of the rise of temperature of the interior of the housing 10 of the vehicular control device by a more simplified structure.

Figure 6:
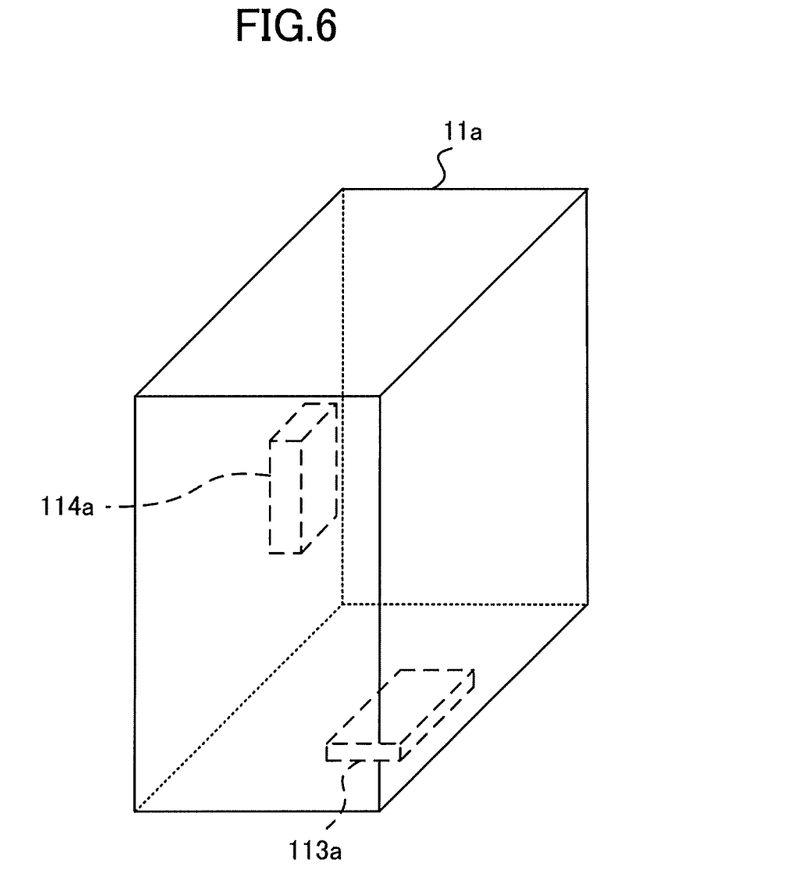
FIG. 6 is a drawing illustrating an example of arrangement of electronic components within a module in an embodiment of the present disclosure.

FIG. 6 is a drawing illustrating an example of arrangement of the electronic components within a module in an embodiment of the present disclosure. In the example of FIG. 6, the module 11a has electronic components 113a and 114a, which have a heat-generation amount greater than or equal to a fourth threshold. The electronic components 113a and 114a, for example, are arranged at positions where the distance from the housing 10 is less than or equal to a fifth threshold.

The fourth threshold can be freely set in response to the heat dissipation performance desired for the vehicular control device 1. The fifth threshold can be freely set in response to the electrical conductivity of the housing 10, for example. For example, the fourth threshold and the fifth threshold may be set so that the electronic components mainly contributing to the rise of temperature within the module 11a are disposed in the vicinity of the housing 10. By location of the electronic components 113a and 114a, which have a high heat-generation amount, within a fixed distance from the housing 10, the heat generated by the electronic components 113a and 114a can be more efficiently released to the air via the housing 10.

Further, for example, among the exterior surfaces of each of the electronic components 113a and 114a, the surface having a largest surface area is arranged facing the one surface of the housing 10 that is positioned most closely to the electronic component 113a and 114a. The surface of the electronic component 113a having the largest surface area faces the bottom surface of the housing 10 facing the housing upper surface 101. The electronic component 114a surface having the largest surface area, among the side surfaces of the housing 10 orthogonal to the direction of disposal of the modules 11a, 11b, 11c, and 11d, faces the side surface most closely to the module 11a. By the electronic component 113a and 114a surfaces having the most surface area facing the one surface of the housing 10 positioned most closely to the electronic components 113a and 114a, the heat generated by the electronic components 113a and 114a can be more efficiently released to the air via the housing 10.

Further, among the exterior surfaces of the electronic components 113a and 114a, surfaces other than the surface having the greatest surface area are covered by a thermal insulating member having a thermal conductivity less than or equal to a sixth threshold. The sixth threshold is set sufficiently small so that transfer of the heat generated by the electronic components 113a and 114a to the interior of the housing 10 can be ignored.

Embodiments of the present disclosure are not limited to the above embodiments, and the aforementioned embodiments may be combined. For example, fins may be provided on the housing 10 for improvement of heat dissipation performance of the vehicular control device 1. The method of interconnecting the modules is not limited to the methods of the aforementioned embodiments, and for example, 2 or more main circuit wirings may be arranged connecting the modules 11a and 11b, and the modules 11a and 11d may be connected via the main circuit wiring. In the vehicular control device 1 according to the embodiments of the present disclosure, the modules arranged at positions separated from each other in the interior of the housing 10, such as the modules 11a and 11d, can be connected by the shortest distance if interconnected by the main circuit wiring extending to the exterior of the housing 10. Further, the main circuit wiring is fixed to the housing 10, and thus during replacement of the modules, replacement may be performed by simply removing the modules from the main circuit wiring, and there is no need to remove the main circuit wiring.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Vehicular control device
10 Housing
11a, 11b, 11c, 11d Module
12a, 12b, 12c Main circuit wiring
13 Waterproofing member
101 Housing upper surface
101a, 101b, 101c, 101d Opening
111a, 111b, 111c, 111d, 112b, 112c Connecting part
113a, 114a Electronic component
121a, 121b, 121c, 122a, 122b, 122c Wiring outlet port

The invention claimed is:

1. A vehicular control device comprising:
a housing to contain a plurality of modules having electronic components;
a main circuit wiring to interconnect the modules contained in the housing, and the main circuit wiring extending exterior of the housing; and
a covering member directly attached to the main circuit wiring that extends exterior of the housing, wherein the covering member is waterproof, electrically insulating and has thermal conductivity;

the portion of the main circuit wiring extending to the exterior of the housing is disposed apart from the housing; and when the vehicular control device is attached to a vehicle main body via an attachment member, the portion of the main circuit wiring is disposed within a range such that a distance from one surface of the vehicular control device facing the vehicle main body is less than or equal to a length of the attachment member in a direction of attachment of the vehicular control device via the attachment member to the vehicle main body.

2. A vehicular control device comprising:

a housing to contain a plurality of modules having electronic components;

a main circuit wiring to interconnect the modules contained in the housing, and the main circuit wiring extending exterior of the housing;

a covering member directly attached to the main circuit wiring that extends exterior of the housing;

an opening formed in the housing and facing one surface of a module of the modules, the one surface having a connecting part connected to the main circuit wiring, the opening having an exterior shape smaller than an exterior shape of the one surface of the module of the plurality of modules; and a waterproofing member disposed along the opening, contacting the housing and the one surface of the module, and having a waterproofing function, wherein the covering member is waterproof, electrically insulating and has thermal conductivity; and the main circuit wiring connects to the connecting part through the opening, and the connecting part is waterproof.

3. A vehicular control device comprising:

a housing to contain a plurality of modules having electronic components;

a main circuit wiring to interconnect the modules contained in the housing, and the main circuit wiring extending exterior of the housing; and a covering member directly attached to the main circuit wiring that extends exterior of the housing, wherein the covering member is waterproof, electrically insulating and has thermal conductivity; and an electronic component of the electronic components is disposed in the interior of the module at a distance from the housing based on a heat-generation amount of the electronic component, an electrical conductivity of the housing and a desired heat dissipation performance of the vehicle control device.

4. The vehicular control device according to claim 1, wherein an electronic component of the electronic components having a relatively high heat-generation amount is arranged so that a surface having a largest surface area is disposed facing one surface of the housing positioned most closely to the electronic component.

5. The vehicular control device according to claim 2, wherein an electronic component of the electronic components having a relatively high heat-generation amount is arranged so that a surface having a largest surface area is disposed facing one surface of the housing positioned most closely to the electronic component.

6. The vehicular control device according to claim 3, wherein an electronic component of the electronic components having a relatively high heat-generation amount is arranged so that a surface having a largest surface area is disposed facing one surface of the housing positioned most closely to the electronic component.

7. The vehicular control device according to claim 4, wherein an exterior surface of the electronic component other than the surface having a largest surface area is covered by a thermal insulation member.

8. The vehicular control device according to claim 5, wherein an exterior surface of the electronic component other than the surface having a largest surface area is covered by a thermal insulation member.

9. The vehicular control device according to claim 6, wherein an exterior surface of the electronic component other than the surface having a largest surface area is covered by a thermal insulation member.

10. The vehicular control device according to claim 1, further comprising a fin extending from an exterior surface of the housing.

11. The vehicular control device according to claim 2, further comprising a fin extending from an exterior surface of the housing.

12. The vehicular control device according to claim 3, further comprising a fin extending from an exterior surface of the housing.

* * * * *